(12) United States Patent
Sbaldi

(10) Patent No.: US 6,712,639 B2
(45) Date of Patent: Mar. 30, 2004

(54) METHOD FOR MANUFACTURING AN ELECTRONIC APPARATUS HAVING A SHIELDING ASSEMBLY AND A PRINTED WIRE BOARD

(75) Inventor: Jean Sbaldi, Plaisir (FR)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/141,764

(22) Filed: May 10, 2002

(65) Prior Publication Data
US 2003/0008558 A1 Jan. 9, 2003

(30) Foreign Application Priority Data
May 12, 2001 (EP) .............................................. 01111623

(51) Int. Cl.$^7$ ............................................... H01R 13/64
(52) U.S. Cl. .......................... 439/378; 29/837; 439/377
(58) Field of Search ................................ 439/374, 377, 439/378; 29/837

(56) References Cited

U.S. PATENT DOCUMENTS

| 4,833,276 A | | 5/1989 | Ito |
| 4,948,923 A | | 8/1990 | Suzuki |
| 5,634,810 A | * | 6/1997 | Niitsu et al. ................. 439/378 |
| 5,885,088 A | * | 3/1999 | Brennan et al. ............. 439/378 |
| 5,888,101 A | * | 3/1999 | Dent et al. ................... 439/378 |
| 6,149,469 A | | 11/2000 | Kim |
| 6,409,540 B1 | * | 6/2002 | Kodama ...................... 439/378 |
| 6,431,886 B1 | * | 8/2002 | Ramey et al. ............... 439/378 |

FOREIGN PATENT DOCUMENTS

| EP | 0 901 317 A1 | 3/1999 |
| EP | 0 910 236 A2 | 4/1999 |
| JP | 08140069 | 5/1996 |
| JP | 09148778 | 6/1997 |

* cited by examiner

Primary Examiner—Gary Paumen
(74) Attorney, Agent, or Firm—Morrison & Foerster LLP

(57) ABSTRACT

An electronic apparatus comprises a front shielding assembly with a generally flat front plane edged with a board to board multipin connector and an antenna pin substantially perpendicular to the plane, and a printed wire board (PWB) generally parallel to and in registration with the front plane. The apparatus is manufactured through applying the printed wire board in the registration and allowing the connector's multiple pins and the antenna pin to protrude through corresponding holes in the printed wire board. In particular, the manufacture comprises the following. First, a mechanical centering of the PWB relative to the shielding assembly is effected through the use of a plurality of edgewise disposed parts of the PWB regarding edge parts of the shielding assembly while executing a first part of an approaching movement between the PWB and the shielding assembly. Thereafter, a further part of the approaching is executed through centering at least one of the multipin connector and the antenna pin on a corresponding hole in the PWB.

13 Claims, 2 Drawing Sheets

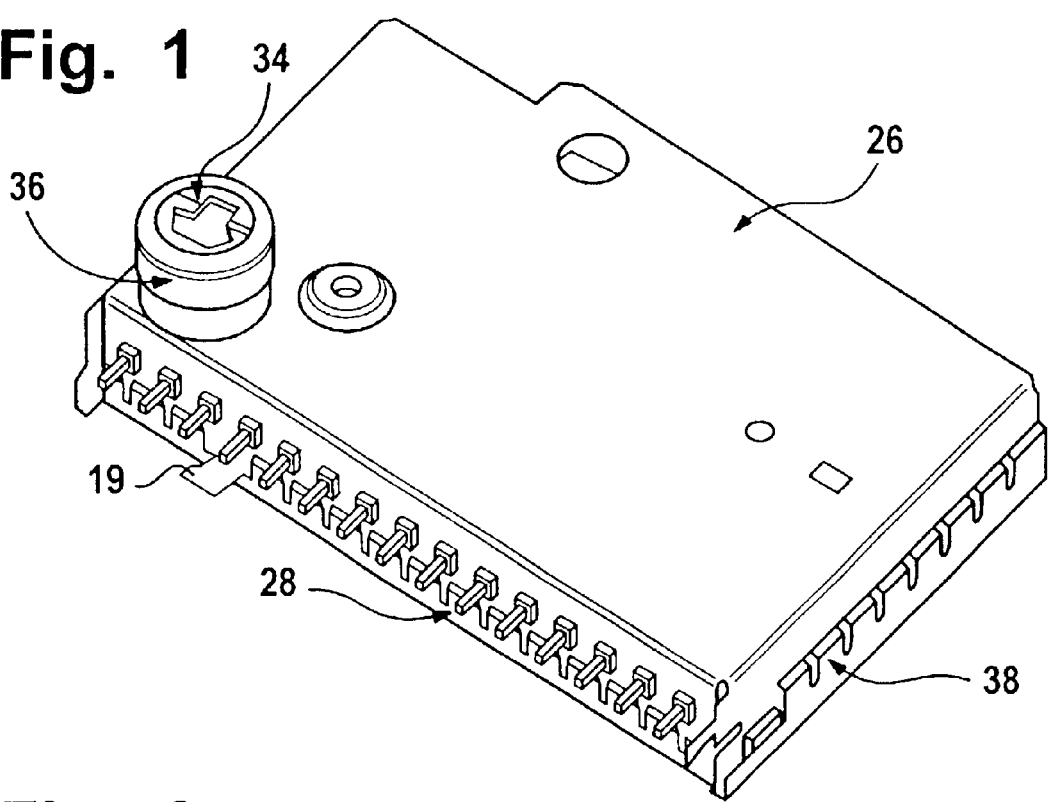
Fig. 1
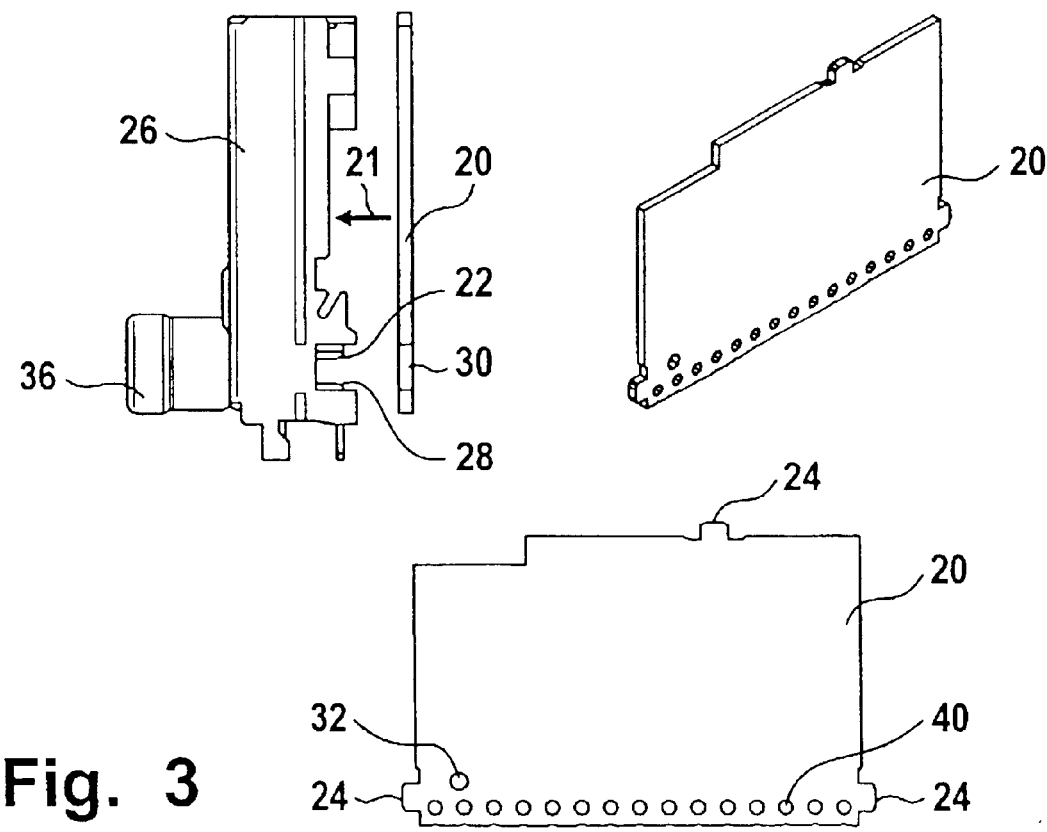
Fig. 2
Fig. 3

Fig. 4
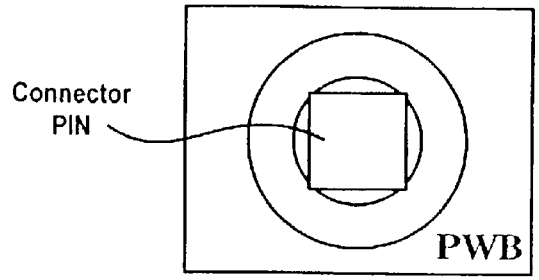
Fig. 5
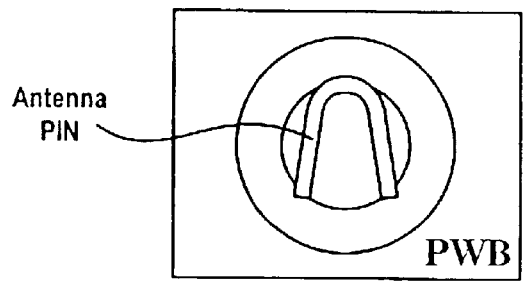
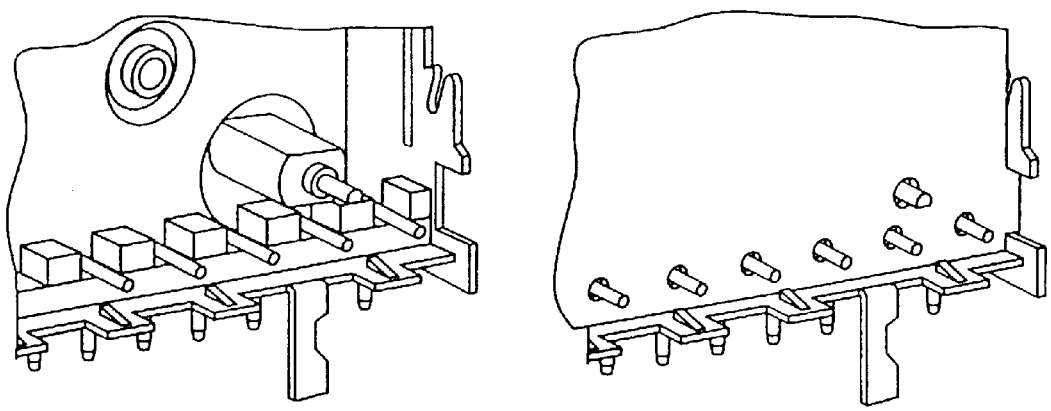
Fig. 6
Fig. 7

METHOD FOR MANUFACTURING AN ELECTRONIC APPARATUS HAVING A SHIELDING ASSEMBLY AND A PRINTED WIRE BOARD

This application claims priority to European Application No. 01111623.3 which was filed in the English language on May 12, 2001.

TECHNICAL FIELD OF THE INVENTION

The invention relates to the manufacture of an electronic circuit device, and in particular, to a device housed in a shielding enclosure apparatus constructed from a front part and a rear part which are both based on a substantially flat main shielding.

BACKGROUND OF THE INVENTION

Patent Abstracts of Japan describes a tuner connector wherein the tuner package connects to various fork-like structures on the board that also provide electrical connections. In this case however, the fine-positioning in a direction along the length of the pins that extend from the tuner package is indetermined. Such indeterminate character would be inappropriate viz à viz the high quality positioning requirements of the present invention.

U.S. Pat. No. 6,149,469 describes the double use of a female plug in the face of two applicable but different types of male plugs that have respective different lengths. Here, only the concentric quality of the male and female plugs is used for effecting a correct position. No reliance on a plurality of centering mechanisms of a complex subsystem as according to the present invention has been envisioned by this reference.

European Patent Application EP A 0 901 317 A1 in the German language discloses a tuner that may be fastened to a printed wire board through the use of two rows of clicking parts which at the same time with positioning, will provide for effecting a variety of electrical contacts. Although apparently representing a well-designed solution, the reference does not teach to use a single linear motion combined with two centering mechanisms in succession to secure an electric circuit-carrying printed wire board to its electromagnetic shield that also allows to effect electrical contacting.

SUMMARY OF THE INVENTION

The invention relates to the manufacture of an electronic circuit device, and in particular, to a device housed in a shielding enclosure apparatus constructed from a front part and a rear part which are both based on a substantially flat main shieldin, whereas the electronics proper are situated therebetween and are mounted on a printed wire board (PWB).

During the development of a subsystem for use as a motor vehicle tuner, the handling of parts on an assembly line should take as little time as possible. Various functions should be realized through the combining of the parts in the subsystem, such as the shielding against interfering electromagnetic fields, the connecting of the printed wire board (PWB) both to the mains power connection and to the tuner proper, the connecting to the vehicle antenna, and the fixation of the tuner by mechanical means.

In one embodiment, the invention relates to an electronic apparatus comprising a front shielding assembly with a generally flat front plane edged with a board to board multipin connector and an antenna pin substantially perpendicular to the plane, and a printed wire board generally parallel to and in registration with the front plane.

In one aspect of the invention, the electronic parts are preferably positioned such that the printed wire board is manufactured in the form of a larger board that comprises a plurality of such elementary boards. After certain manufacturing steps have been applied thereto, the elementary boards will be separated by a mechanical operation, such as breaking along predetermined break lines or "points". The tolerances incurred in such breaking may be used in a preliminary positioning step of the PWB relative to the shielding. A subsequent final positioning step could then be used to secure the PWB to its final position.

The present invention uses breaking edges for a preliminary positioning, so that the subsequent operations will go smoothly.

In another embodiment of the invention, there is a method of effecting a mechanical centering of the PWB relative to the shielding assembly through the use of a plurality of edgewise disposed parts of the PWB regarding edge parts of the shielding assembly while executing a first part of an approaching movement between the PWB and the shielding assembly, and thereafter executing another part of the approaching through centering at least one of the multipin connector and the antenna pin on a corresponding hole in the PWB.

BRIEF DESCRIPTION OF THE DRAWINGS

These and further aspects and advantages of the invention will be discussed more in detail hereinafter with reference to the disclosure of preferred embodiments, and in particular with reference to the appended Figures in which:

FIG. 1 shows an "outside" of the shielding arrangement according to the present invention.

FIG. 2 shows a side view of the registration of tuner PWB and shielding arrangement.

FIG. 3 shows a detailed view of the tuner PWB.

FIG. 4 shows a PWB hole/connector pin arrangement.

FIG. 5 shows a PWB hole/antenna pin arrangement.

FIG. 6 shows a 3D design simulation without PWB.

FIG. 7 shows a 3D design simulation with PWB.

DETAILED DESCRIPTION OF THE PREFERRED EMBODIMENTS

FIG. 1 illustrates an "outside" view of the shielding apparatus according to the present invention. The shielding assembly 26 effectively comprises the front cover of a "box", which is to be combined with a rear cover 38 to when combined comprises a shielding enclosure. Their mutual fastening is effected through a structure that will be disclosed in more detail with reference to the Figures below. Item 36 is an ISO-standardized extruded frame antenna, that inside has a plastic contact holder 34. Various other features are illustrated, but not described, in FIG. 1. The double-sided cover may be used as a housing for an electronic circuit such as a tuner, although various other fields of application are feasible as well. In the embodiment, the electronic circuitry has a shielded signal input connected to the central pin of antenna frame 36, as well as an output for outputting a user signal such as audio or data.

The subsystem had a reflow connector, that is mounted by automatic insertion, which is a high-precision operation step viz à viz the PWB, inasmuch as the insertion tolerance is determined by the tolerance of the connector itself. In particular, this means that the fixing of the complete subassembly is governed by the tolerance of the reflow connector, which is about 0.1 millimeter. Now, the invention has allowed to set a more uniform tolerance for the whole subassembly at about 0.2 millimeter.

Earlier designs needed an intermediate metal part connecting the tuner PWB and the coax antenna pin. There, the locating of the shielding was effected during insertion through two pins that protruded through holes in the PWB. In contrast, the present invention has a straight or immediate connection with the PWB without addition of further parts, which allows to immediately effect the connection during insertion of the shielding. The mounting procedure now involves an auto-centering of the shielding that uses breaking "points", which effectively will have a certain size. Subsequently, the pins will be located inside their respective own holes just as the antenna pin, as will be discussed with reference to FIG. 2 below. The procedure according to the invention was also driven by the wish to shrink the size of the overall apparatus relative to an earlier design.

FIG. 2 illustrates a side view of the registration of tuner PWB and shielding apparatus according to the present invention. The shielding 26 carries frame antenna 36, an antenna pin 22 and a row of connector pins 28 of which a single one is visible. The printed wire board has been shown in correct registration regarding the shielding, and in particular the PWB locating areas (top and bottom) have been given a darker representation. The latter PWB has also been shown in a roughly 3D manner at right.

FIG. 3 illustrates a detailed view of the tuner PWB with connector holes 40, antenna hole 32, and three pre-centering and breaking areas 24. The mounting procedure is desribed as follows. At the start, an arrangement of six PWB boards is presented for automatic insertion. These are then separated by a person or mechanically and presented to the automatic process. During the initial part of the inserting, the PWB is brought in contact with the shield, during which the PCB will be centered through the breaking points 24.

Now according to the embodiment, the insertion proceeds as follows. At first, moving along arrow 21 in FIG. 2, the PWB comes into contact with the shielding, while the three breaking points effect a preliminary centering among the two parts. Next, after a further movement of about, or preferably over 1.5 millimeters, the antenna and connector pins are able to pass through the associated holes in the PWB. The movement along the arrow proceeds further, until a click sound is caused by several clips that are positioned on the shielding along the connector. This means that the shielding has indeed arrived at the correct position, which will then be temporarily maintained by the clips. Next, after this temporary locking, the PWB will be fixed permanently to the shielding by twisting three legs that are located close to the respective locating areas. These may be shaped as the one shown in FIG. 1 at the left lower edge (19). Finally, the necessary electrical connections are secured by wave soldering.

The above procedure will locate and fix the PWB and shielding with respect to each other, which is effected by a simple twisting tool operating on the above three legs under the sub PWB. Furthermore, the Through Hole Connector between the two boards is inserted, just as the Through Hole Coaxial Antenna. Finally, the cooling system is effected through immediate contacts. The final wave soldering will care for the following. It will connect the shielding to the PWB ground of the tuner electronics. It will connect the pin coaxial antenna. And finally, it will strengthen the fixation between the shielding board and the tuner through the mechanical strength of the solder itself.

Advantageously, a single part is inserted for connecting the PWB tuner, antenna, and shielding to ground. There is also a larger insertion tolerance on a car radio PWB than associated to a reflow connector solution alone. Finally, the technology provides a more robust design because of the prelocating of the PWB based on the prelocating of the pins through their respective holes.

FIG. 4 illustrates a PWB hole/connector pin arrangement, to show the improved ease of insertion. During the first locating of the shielding viz à viz the tuner, PWB uses the breaking points of the PWB for effecting the centering. On the basis of a tolerance of 1.5 millimeters at 30° C., this will allow a tolerance of about +/−0.8 millimeters in both X- and Y-directions. An approximately 1.5 millimeter length insertion will thus effect a provisional centering of the connector and antenna pins regarding their PWB holes.

The gap between the connector pins and PWB holes will for the locating between the PWB and the shielding allow the connector to have a locating axis tolerance of about 0.35 millimeters. The PWB hole tolerance is about 1.6+/−0.1 millimeters. A square connector pin will under worst case have an overall (diagonal) diameter of about 0.9 millimeters (i.e. $0.64\sqrt{2}$), which is nearly exactly equal to the diameter of the inner hole in the preferred embodiment.

FIG. 5 illustrates a PWB hole/antenna pin arrangement. Here, the positioning of the antenna pin results from frame extrusion. The quality of the frame extrusion deals with the positioning. The diameter of the antenna pin is about 0.35 millimeter, the PWB hole is about 2.0+/−0.1 millimeters, the central part is about 1.0+/−0.05 millimeters, both as shown.

For further illustration, FIG. 6 shows a 3D design simulation without PWB, including the antenna pin, edge connector, antenna pin, and the edge of the shielding enclosure. FIG. 7 illustrates the same but with PWB in place. The various electrical pins neatly protrude through the holes in the PCB.

What is claimed is:

1. A method for manufacturing an electronic apparatus, comprising:
   mechanically centering a printed wire board relative to a shielding assembly using a plurality of edgewise disposed parts of the printed wire board with respect to edge parts of the shielding assembly, while executing a first part of an approaching movement between the printed wire board and the shielding assembly; and
   executing a second part of the approaching movement through centering at least one of a plurality of multipin connectors and an antenna pin on a corresponding hole in the printed wire board.

2. The method as claimed in claim 1, wherein the second part, through a click operation of a mechanism secured to the shielding assembly via an element of the printed wire board, is terminated.

3. The method as claimed in claim 2, wherein, after termination of the second part, a fixating operation is executed on one or more elements of the shielding assembly.

4. The method as claimed in claim 1, wherein the first and second parts comprise a substantially linear motion of the printed wired board.

5. The method as claimed in claim 1, wherein the second part has a closer tolerance than the first part.

6. An apparatus as manufactured, comprising:
   a front shielding assembly with a substantially flat front plane edged with a board to board multipin connector;

an antenna pin substantially perpendicular to the plane;

a printed wire board substantially parallel to and in contact with the front plane, the printed wire board, the connector's multiple pins and the antenna pin protrude through corresponding holes in the printed wire board;

a first mechanical centering device in the printed wire board and relative to the shielding assembly using a plurality of edgewise disposed parts of the printed wire board with respect to edge parts of the shielding assembly in a first approaching position between the printed wire board and the shielding assembly; and a second centering device operative in a second approaching position through centering at least one of the multipin connector and the antenna pin on a corresponding hole in the printed wire board.

7. The apparatus as claimed in claim 6, wherein the apparatus has a tuner functionality.

8. The method as claimed in claim 2, wherein the first and second parts comprise a substantially linear motion of the printed wired board.

9. The method as claimed in claim 3, wherein the first and second parts comprise a substantially linear motion of the printed wired board.

10. The method as claimed in claim 2, wherein the second part has a closer tolerance than the first part.

11. The method as claimed in claim 3, wherein the second part has a closer tolerance than the first part.

12. The method as claimed in claim 4, wherein the second part has a closer tolerance than the first part.

13. The method for manufacturing an electronic apparatus of claim 1, wherein the front shielding assembly has a flat front plane edged with a board to board multipin connector and an antenna pin substantially perpendicular to the plane, and the printed wire board is parallel to and in contact with the front plane, thereby applying the printed wire board in the contact and allowing the connector's multiple pins and the antenna pinto protrude through corresponding holes in the printed wire board.

* * * * *